United States Patent
Choi et al.

(10) Patent No.: US 8,921,890 B2
(45) Date of Patent: Dec. 30, 2014

(54) SUBSTRATE STRUCTURE, SEMICONDUCTOR DEVICE FABRICATED FROM THE SAME, AND METHOD OF FABRICATING THE SEMICONDUCTOR DEVICE

(75) Inventors: Hyuk-soon Choi, Hwaseong-si (KR); Jong-seob Kim, Hwaseong-si (KR); Jai-kwang Shin, Anyang-si (KR); Chang-yong Um, Seoul (KR); Jae-joon Oh, Seongnam-si (KR); Jong-bong Ha, Yongin-si (KR); In-jun Hwang, Hwaseong-si (KR); Ki-ha Hong, Cheonan-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 13/551,217

(22) Filed: Jul. 17, 2012

(65) Prior Publication Data

US 2013/0175538 A1   Jul. 11, 2013

(30) Foreign Application Priority Data

Jan. 11, 2012   (KR) .................. 10-2012-0003447

(51) Int. Cl.
*H01L 31/102* (2006.01)
(52) U.S. Cl.
USPC .......................................... 257/189; 257/330
(58) Field of Classification Search
USPC ............ 257/76, 189, E29.262, E21.409, 330, 257/E29.089; 438/270, 197
See application file for complete search history.

(56) References Cited

U.S. PATENT DOCUMENTS

| | | | |
|---|---|---|---|
| 7,723,751 B2 | 5/2010 | Kawasaki et al. | |
| 7,728,348 B2 | 6/2010 | Kasai et al. | |
| 8,426,895 B2 * | 4/2013 | Okamoto et al. | 257/219 |
| 2001/0040246 A1 | 11/2001 | Ishii | |
| 2006/0220060 A1 * | 10/2006 | Nakata et al. | 257/189 |
| 2008/0251801 A1 | 10/2008 | Ueno et al. | |
| 2012/0056202 A1 * | 3/2012 | Wada et al. | 257/77 |
| 2013/0099308 A1 * | 4/2013 | Gruber et al. | 257/330 |
| 2014/0014994 A1 * | 1/2014 | Chen et al. | 257/98 |

FOREIGN PATENT DOCUMENTS

| | | | |
|---|---|---|---|
| CN | 1828837 | * | 9/2006 |
| JP | 2004-103833 A | | 4/2004 |
| JP | 2006-286910 A | | 10/2006 |
| JP | 2008-010766 A | | 1/2008 |
| JP | 2009-117583 A | | 5/2009 |
| JP | 2010-232455 A | | 10/2010 |
| JP | 2010-288731 | | 12/2010 |

* cited by examiner

*Primary Examiner* — Jarrett Stark
*Assistant Examiner* — Shahed Ahmed
(74) *Attorney, Agent, or Firm* — Harness, Dickey & Pierce, P.L.C.

(57) ABSTRACT

According to example embodiments, a substrate structure may include a GaN-based third material layer, a GaN-based second material layer, a GaN-based first material layer, and a buffer layer on a non-GaN-based substrate. The GaN-based first material layer may be doped with a first conductive type impurity. The GaN-based second material layer may be doped with a second conductive type impurity at a density that is less than a density of the first conductive type impurity in the first GaN-based material layer. The GaN-based third material layer may be doped with a first conductive type impurity at a density that is less than the density of the first conductive type impurity of the GaN-based first material layer. After a second substrate is attached onto the substrate structure, the non-GaN-based substrate may be removed and a GaN-based vertical type semiconductor device may be fabricated on the second substrate.

19 Claims, 10 Drawing Sheets

SUBSTRATE STRUCTURE, SEMICONDUCTOR DEVICE FABRICATED FROM THE SAME, AND METHOD OF FABRICATING THE SEMICONDUCTOR DEVICE

CROSS-REFERENCE TO RELATED APPLICATION

This application claims priority under 35 U.S.C. §119 to Korean Patent Application No. 10-2012-0003447, filed on Jan. 11, 2012, in the Korean Intellectual Property Office, the disclosure of which is incorporated herein in its entirety by reference.

BACKGROUND

1. Field

Example embodiments relate to substrate structures, semiconductor devices fabricated from the same, and/or methods of fabricating the semiconductor devices.

2. Description of the Related Art

A gallium nitride (GaN)-based semiconductor may have excellent material properties, such as a large energy gap, high thermal and chemical stability, high electron saturation speed ($\sim$3×10$^7$ cm/sec), etc. Furthermore, an electronic device employing a GaN-based semiconductor may have a high breakdown electric field ($\sim$3×10$^6$ V/cm), a high maximum current density, stable operation characteristics at high temperatures, a high thermal conductivity, etc. Due to such material properties, a GaN-based semiconductor may be applied to optical devices, high frequency and high power electronic device and a power device.

In fabricating a vertical type device by using a GaN-based nitride semiconductor, a GaN bulk wafer may be used. However, it may be difficult to fabricate a GaN bulk wafer having a large area (that is, a large diameter), and a GaN bulk wafer may be more expensive than other non-GAN substrate materials.

SUMMARY

Example embodiments relate to substrate structures that may be applied to fabrication of GaN-based semiconductor devices, instead of GaN bulk wafers in the related art.

Example embodiments relate to methods of fabricating semiconductor devices (e.g., GaN-based vertical type semiconductor devices) from the substrate structures.

Example embodiments relate to semiconductor devices fabricated from the substrate structures. Example embodiments relate to semiconductor devices that have excellent voltage withstanding properties and that may be scaled down.

Additional aspects will be set forth in part in the description which follows and, in part, will be apparent from the description, or may be learned by practice of the presented embodiments.

According to example embodiments, a substrate structure includes a non-GaN-based substrate; a buffer layer on the non-GaN-based substrate; a GaN-based first material layer on the buffer layer, the GaN-based first layer being doped with a first impurity that is a first conductive type; a GaN-based second material layer on the GaN-based first material layer, the GaN-based second material layer being doped with a second impurity that is a second conductive type, the GaN-based second material layer having a density of the second impurity that is less than a density of the first impurity in the first GaN-based material layer; and a GaN-based third material layer on the GaN-based second material layer, the GaN-based third material layer being doped with a third impurity that is the first conductive type, the GaN-based third material layer having density of the third impurity that is lower than the density of the first impurity in the GaN-based first material layer.

The non-GaN-based substrate may be one of a Si substrate, a sapphire substrate, and a SiC substrate.

The density of the first impurity of the GaN-based first material layer may be about 10$^{18}$/cm$^3$ to about 10$^{21}$/cm$^3$.

The density of the second impurity of the GaN-based second material layer may be from about 10$^{14}$/cm$^3$ to about 10$^{18}$/cm$^3$.

The density of the third impurity of the GaN-based third material layer may be from about 10$^{14}$/cm$^3$ to about 10$^{18}$/cm$^3$.

The substrate structure may further include a GaN-based fourth material layer on the GaN-based third material layer. The GaN-based fourth material layer may be is doped with a fourth impurity that is the first conductive type. A density of the fourth impurity of the GaN-based fourth material layer may be greater than at least one of the density of the second impurity of the GaN-based second material layer and the density of the first impurity of the GaN-based third material layer.

The GaN-based fourth material layer may be doped with the fourth impurity at a density of from about 10$^{18}$/cm$^3$ to about 10$^{21}$/cm$^3$.

The first conductive type may be n-type, and the second conductive type may be p-type. The first impurity may be the same material as the third impurity.

Thickness of the GaN-based first material layer may be from about 100 nm to about 1 μm, for example.

Thickness of the GaN-based second material layer may be from about 100 nm to about 2 μm, for example.

Thickness of the GaN-based third material layer may be from about 2 μm to about 10 μm, for example.

Thickness of the GaN-based fourth material layer may be from about 100 nm to about 1 μm, for example.

According to example embodiments, a method of fabricating a semiconductor device includes attaching a second substrate onto a substrate structure including a buffer layer, a first contact layer having a first conductive type, a channel layer having a second conductive type, and a drift layer having a first conductive type sequentially stacked on a first substrate; removing the first substrate and the buffer layer from the substrate structure; and forming a device on the second substrate, the device being based on the drift layer, the channel layer, and the first contact layer.

The forming the device may include forming a groove by etching a portion of the first contact layer and a portion of the channel layer, the groove exposing a part of the drift layer; forming a gate insulation layer to cover the groove; and forming at least two first electrodes on the first contact layer and around the groove; and forming a gate electrode on the gate insulation layer in the groove region.

The second substrate may include a second electrode.

The method may further include forming a second electrode in the second substrate, wherein the second electrode is electrically connected to the drift layer.

The second substrate may be one of a Si substrate, a SiC substrate, an AlN substrate, a direct bonded copper (DBC) substrate, and a metal substrate.

At least one of the first contact layer, the channel layer, and the drift layer may include a GaN-based material.

The first contact layer, the channel layer, and the drift layer may include GaN.

The first contact layer doped with a first impurity that is the first conductive type at a density of from about $10^{18}$/cm$^3$ to about $10^{21}$/cm$^3$.

The channel layer may be doped with a second impurity that is the second conductive type at a density of from about $10^{14}$/cm$^3$ to about $10^{18}$/cm$^3$.

The drift layer may be doped with a third impurity that is the first conductive type at a density of from about $10^{14}$/cm$^3$ to about $10^{18}$/cm$^3$.

The substrate structure may further include a second contact layer on the drift layer. In this case, in the semiconductor device, the second contact layer may be between the second substrate and the drift layer.

The second contact layer may be doped with a fourth impurity that is the first conductive type at a density of from about $10^{18}$/cm$^3$ to about $10^{21}$/cm$^3$.

The first conductive type may be n-type, and the second conductive type may be p-type. The first impurity may be the same material as the third impurity. The fourth impurity may be the same material as the first impurity and/or the third impurity.

The method may further include forming a bonding layer between the substrate structure and the second substrate.

According to example embodiments, a semiconductor device includes a substrate including a drain electrode; a metal layer on the substrate; a drift layer on the metal layer, the drift layer having a first conductive type; a stacked structure on the drift layer, the stacked structure including a channel layer having a second conductive type and a first contact layer having the first conductive type, the channel layer and the first contact layer defining a groove that exposes the drift layer; a gate insulation layer covering the groove; a gate on the gate insulation layer; and a source electrode contacting the first contact layer.

The substrate may be used as the drain electrode.

A hole that exposes the metal layer may be formed in the substrate, and the drain electrode may be in the hole.

At least one of the contact layer, the channel layer, and the drift layer may include a GaN-based material.

The contact layer, the channel layer, and the drift layer may include GaN.

The contact layer may be doped with a first impurity that is the first conductive type at a density of from about $10^{18}$/cm$^3$ to about $10^{21}$/cm$^3$.

The channel layer may be doped with a second impurity that is the second conductive type at a density of from about $10^{14}$/cm$^3$ to about $10^{18}$/cm$^3$.

The drift layer may be doped with a third impurity that is the first conductive type at a density of from about $10^{14}$/cm$^3$ to about $10^{18}$/cm$^3$.

A second contact layer may be further between the metal layer and the drift layer.

The second contact layer may be doped with a fourth impurity that is the first conductive type at a density of from about $10^{18}$/cm$^3$ to about $10^{21}$/cm$^3$.

The first conductive type may be n-type, and the second conductive type may be p-type. The first impurity may be the same material as the third impurity. The fourth impurity may be the same material as the first impurity and/or the third impurity.

According to example embodiments, a semiconductor device includes: a drain electrode; a metal layer on the drain electrode; a drift layer on the metal layer, the drift layer having a first conductive type; a channel layer having a second conductive type and a first contact layer having the first conductive type on the drift layer, the channel layer and the first contact layer defining a groove that exposes the drift layer; a gate insulating layer in the groove; a gate electrode on the gate insulating layer; and at least one source electrode on the first contact layer.

The semiconductor device may further include a substrate defining a hole. The drain electrode may be in the hole.

The semiconductor device may further include a second contact layer on the metal layer. The second contact layer may have the first conductive type. The second contact layer may have a density of a first conductive type impurity that is different than a density of a first conductive type impurity in the drift layer.

The first contact layer may be doped with a first impurity that is the first conductive type at a density of $10^{18}$/cm$^3$ to about $10^{21}$/cm$^3$.

The channel layer may be doped with a second impurity that is the second conductive type at a density of from about $10^{14}$/cm$^3$ to about $10^{18}$/cm$^3$.

The drift layer may be doped with a third impurity that is the first conductive impurity at a density of from about $10^{14}$/cm$^3$ to about $10^{18}$/cm$^3$.

BRIEF DESCRIPTION OF THE DRAWINGS

These and/or other aspects will become apparent and more readily appreciated from the following description of non-limiting embodiments, as illustrated in the accompanying drawings in which like reference characters refer to the same parts throughout the different views. The drawings are not necessarily to scale, emphasis instead being placed upon illustrating the principles of inventive concepts. In the drawings:

FIG. 3J is a cross-sectional view showing a semiconductor device according to example embodiments;

FIG. 5B is a cross-sectional view showing a semiconductor device according to example embodiments.

DETAILED DESCRIPTION

Figure 1:
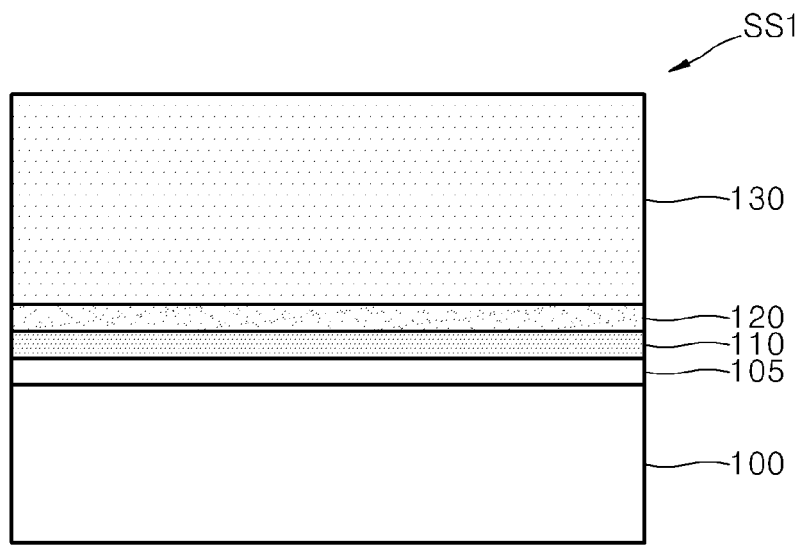
FIG. 1 is a cross-sectional view of a substrate structure according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Substrate structures, semiconductor devices fabricated from the same, and methods of fabricating the semiconductor devices will now be described more fully with reference to the accompanying drawings.

FIG. 1 is a cross-sectional view of a substrate structure SS1 according to example embodiments.

Referring to FIG. 1, a buffer layer 105 may be arranged on a substrate 100. The substrate 100 may be a non-GaN-based substrate. For example, the substrate 100 may be one of a Si substrate, a sapphire substrate, and a SiC substrate. However, the types of the substrate 100 are not limited thereto and may vary. The buffer layer 105 may include a transition layer. The buffer layer 105 may be used for buffering the differences of lattice constant and thermal expansion coefficient between the substrate 100 and an n-type contact layer 110 formed thereon, thereby limiting (and/or preventing) deterioration of crystallinity of the n-type contact layer 110. The buffer layer 105 may have a single-layer structure or a multi-layer structure including one or more materials selected from among nitrides including at least one of Al, Ga, In, and B, for example. In detail, the buffer layer 105 may have a single-layer structure or a multi-layer structure including at least one of AlN, GaN, AlGaN, AlInN, AlGaInN, etc. A thickness of the buffer layer 105 may be from about 100 nm to about 5 μm, for example.

The n-type contact layer 110, a p-type channel layer 120, and an n-type drift layer 130 may be stacked on the buffer layer 105 in the order stated. At least one of the n-type contact layer 110, the p-type channel layer 120, and the n-type drift layer 130 may include a GaN-based material. For example, all of the n-type contact layer 110, the p-type channel layer 120, and the n-type drift layer 130 may include GaN. The n-type contact layer 110 may be a densely-doped layer (highly-doped layer) that is doped with an n-type impurity at a density (concentration) of from about $10^{18}/cm^3$ to about $10^{21}/cm^3$ (that is, an n+ layer). The p-type channel layer 120 may be a lightly-doped layer that is doped with a p-type impurity at a density (concentration) of from about $10^{14}/cm^3$ to about $10^{18}/cm^3$ (that is, a p– layer). The n-type drift layer 130 may be a lightly-doped layer that is doped with an n-type impurity at a density (concentration) of from about $10^{14}/cm^3$ to about $10^{18}/cm^3$ (that is, an n– layer). Therefore, the n-type contact layer 110 may be an n+ GaN layer, the p-type channel layer 120 may be a p– GaN layer, and the n-type drift layer 130 may be an n– GaN layer. A thickness of the n-type contact layer 110 may be from about 100 nm to about 1 μm, a thickness of the p-type channel layer 120 may be from about 100 nm to about 2 μm, and a thickness of the n-type drift layer 130 may be from about 2 μm to about 10 μm, for example. However, example embodiments are not limited thereto.

Silicon (Si) may be used as the n-type impurity in the n-type contact layer 110 and/or the n-type drift layer 130, and Magnesium (Mg) may be used as the p-type impurity in the p-type channel layer 120. However, example embodiments are not limited thereto. For example, Germanium (Ge), Selenium (Se), and/or Oxygen (O) may be used as the n-type impurity in the n-type contact layer 110 and/or n-type drift layer 130, and Beryllium (Be), Mercury (Hg), Carbon (C), Zinc (Zn), Calcium (Ca), and/or Cadmium (Cd) may be used as p-type impurity in the p-type channel layer 120.

Regarding the n-type contact layer 110, the p-type channel layer 120, and the n-type drift layer 130, the terms "contact layer," "channel layer," and "drift layer" are used in consideration of functions of the layers when the substrate structure SS1 is applied to a semiconductor device. However, when the substrate structure SS1 has not been applied to a semiconductor device, the n-type contact layer 110, the p-type channel layer 120, and the n-type drift layer 130 may be referred to as "a first material layer," "a second material layer," and "a third material layer," respectively. The first material layer (that is, 110) may be a GaN-based material layer that is doped with an n-type impurity at a high density of from about $10^{18}/cm^3$ to about $10^{21}/cm^3$. The second material layer (that is, 120) may be a GaN-based material layer that is doped with a p-type impurity at a low density of from about $10^{14}/cm^3$ to about $10^{18}/cm^3$. The third material layer (that is, 130) may be a GaN-based material layer that is doped with an n-type impurity at a low density of from about $10^{14}/cm^3$ to about $10^{18}/cm^3$. Therefore, the first material layer (that is, 110) may be an n+ GaN layer, the second material layer (that is, 120) may be a p– GaN layer, and the third material layer (that is, 130) may be an n– GaN layer.

Figure 2:
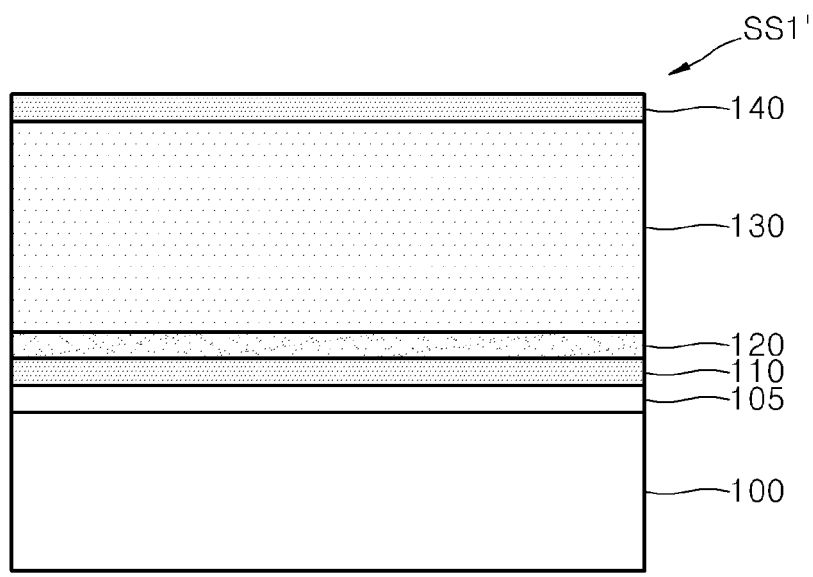
FIG. 2 is a cross-sectional view of a substrate structure according to example embodiments.

FIG. 2 is a cross-sectional view of a substrate structure SS1' according to example embodiments. Compared to the substrate structure SS1 shown in FIG. 1, an n-type second contact layer 140 is added to the substrate structure SS1' shown in FIG. 2.

Referring to FIG. 2, the buffer layer 105, the n-type contact layer (referred to hereinafter as an n-type first contact layer) 110, the p-type channel layer 120, and the n-type drift layer 130 are arranged on the substrate 100 in the order stated, where the n-type second contact layer 140 is further arranged on the n-type drift layer 130. Similar to the n-type first contact layer 110, the n-type second contact layer 140 may be a densely-doped layer (highly-doped layer) that is doped with an n-type impurity at a density (concentration) of from about $10^{18}/cm^3$ to about $10^{21}/cm^3$ (that is, an n+ layer). The n-type second contact layer 140 may be formed of a material similar to or the same as the material constituting the n-type first contact layer 110. In other words, the n-type second contact layer 140 may include a GaN-based material, e.g., GaN. Therefore, the n-type second contact layer 140 may be an n+ GaN layer. Thickness of the n-type second contact layer 140 may also be similar to or same as the thickness of the n-type first contact layer 110. For example, a thickness of the n-type second contact layer 140 may be from about 100 nm to about 1 μm. Silicon (Si) may be used as the n-type impurity in the n-type second contact layer 140, but example embodiments are not limited thereto. For example, Germanium (Ge), Selenium (Se), and/or Oxygen (O) may be used as the n-type impurity in the n-type in the n-type second contact layer 140.

If the n-type first contact layer 110, the p-type channel layer 120, the n-type drift layer 130, and the n-type second contact layer 140 are referred to as a first material layer, a second material layer, a third material layer, and a fourth material layer, respectively, the first through fourth material layers (that is, 110~140) may be an n+ GaN layer, a p– GaN layer, an n– GaN layer, and an n+ GaN layer, respectively. Doping densities (concentrations) and thicknesses of the first through fourth material layers are as described above, and thus, detailed description thereof is omitted.

In the substrate structures SS1 and SS1' in FIGS. 1 and 2, the n-type contact layers 110 and 140, the p-type channel layer 120, and the n-type drift layer 130 may have different conductive types. For example, conductive types of the n-type contact layers 110 and 140, the p-type channel layer 120, and the n-type drift layer 130 may be switched to the opposite type, respectively. In other words, the n-type contact layers 110 and 140 may be replaced with p-type contact layers, the p-type channel layer 120 may be replaced with an n-type channel layer, and the n-type drift layer 130 may be replaced with a p-type drift layer. Here, the p-type contact layer may be a p+ layer, the n-type channel layer may be an n– layer, and the p-type drift layer may be a p– layer. Furthermore, base materials constituting the p-type contact layer, the n-type channel layer, and the p-type drift layer may be GaN-based materials.

In the substrate structures SS1 and SS1' shown in FIGS. 1 and 2, the substrate 100 may be a non-GaN-based substrate, and the layers stacked thereon 110, 120, 130, and 140 may be GaN-based material layers. Therefore, the substrate structures SS1 and SS1' may have a GaN-on-substrate (GOS) structure. The substrate structures SS1 and SS1' may be applied to fabrications of various semiconductor devices (e.g., GaN-based semiconductor devices). By using the substrate structures SS1 and SS1' according to embodiments, cost for fabricating a semiconductor device (e.g., a GaN-based semiconductor device) may be reduced, and productivity may be improved. A GaN bulk wafer in the related art is difficult to be fabricated to a large size (that is, a large diameter) and is expensive. Therefore, if a GaN-based device is fabricated by using a GaN bulk wafer, mass production is difficult and fabrication cost increases. However, since the substrate structures SS1 and SS1' according to embodiments are fabricated based on non-GaN-based substrates, the substrate structures SS1 and SS1' may be fabricated at relatively low costs and to large sizes (that is, large diameters). For example, the substrate structures SS1 and SS1' may have diameters of 8 inches or greater. Therefore, by using the substrate structures SS1 and SS1', cost for fabricating a semiconductor device (e.g., a GaN-based semiconductor device) may be reduced, and productivity may be improved.

FIGS. 3A through 3J are cross-sectional views showing a method of fabricating a semiconductor device, according to example embodiments.

Figure 3A:
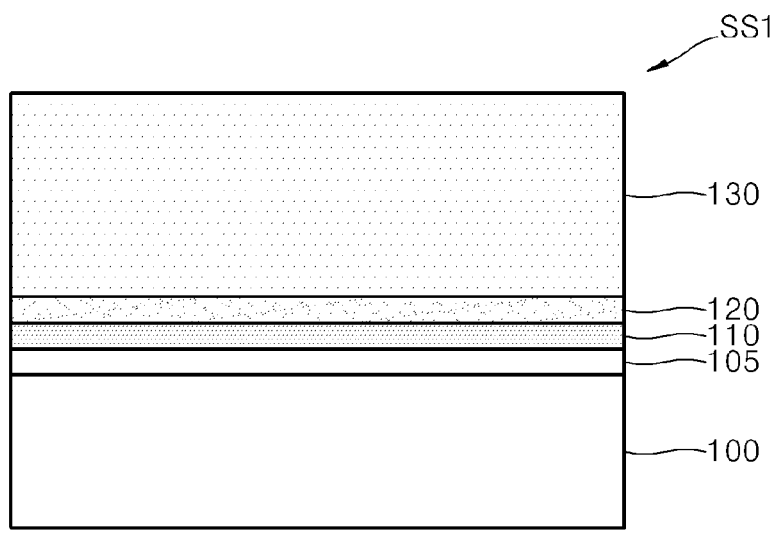
FIGS. 3A through 3J are cross-sectional views showing a method of fabricating a semiconductor device, according to example embodiments.

Referring to FIG. 3A, a substrate structure SS1 may be provided. The substrate structure SS1 may have a structure in which a buffer layer 105, an n-type contact layer 110, a p-type channel layer 120, and an n-type drift layer 130 are stacked in the order stated, on a substrate (referred to hereinafter as a first substrate) 100. The first substrate 100, the buffer layer 105, the n-type contact layer 110, the p-type channel layer 120, and the n-type drift layer 130 may correspond to the substrate 100, the buffer layer 105, the n-type contact layer 110, the p-type channel layer 120, and the n-type drift layer 130 of FIG. 1, respectively. Therefore, the substrate structure SS1 of FIG. 1 may be used as a starting substrate structure. Although FIG. 3A shows that the substrate structure SS1 has a size corresponding to a single device region, the size (e.g., width, diameter) of the substrate structure SS1 may be increased to 8 inches or greater.

Figure 3B:
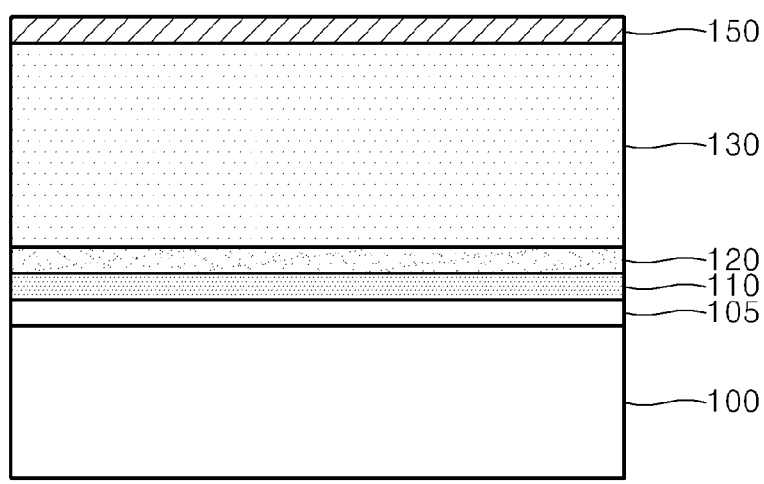

Referring to FIG. 3B, a bonding layer 150 may be formed on the n-type drift layer 130. The bonding layer 150 may be formed of a conductive material. For example, the bonding layer 150 may be a metal layer formed of a desired (or alternatively predetermined) or given metal. In detail, the bonding layer 150 may be formed as a single layer structure or a multi-layer structure including at least one of Cu, Au, Sn, and an alloy thereof.

Figure 3C:
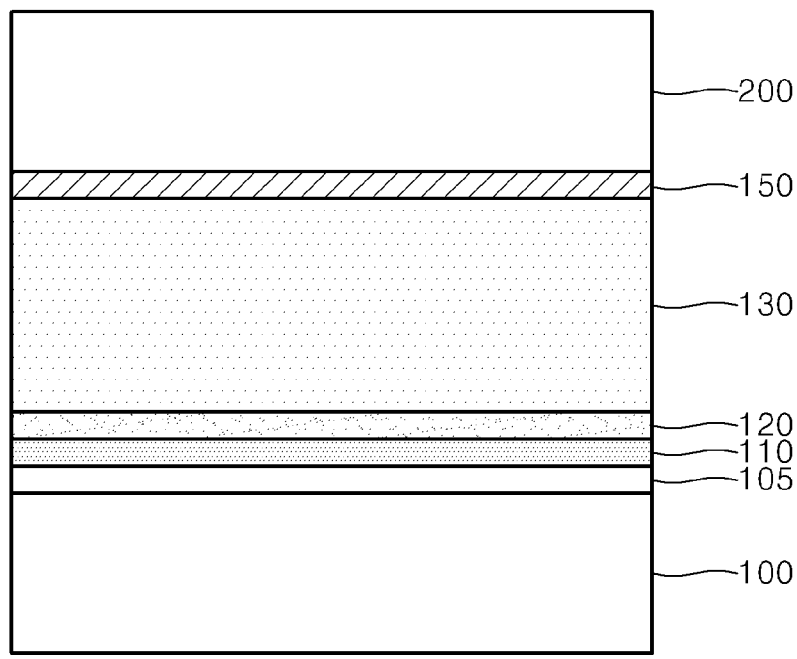

Referring to FIG. 3C, a second substrate 200 may be attached onto the bonding layer 150. The second substrate 200 may be one of a Si substrate, a SiC substrate, an AlN substrate, a direct bonded copper (DBC) substrate, and a metal substrate, for example. The second substrate 200 may be a non-GaN-based substrate. However, the types of the second substrate 200 are not limited thereto and may vary. Furthermore, if necessary, a second bonding layer (not shown) may be formed on a lower surface of the second substrate 200, and then the second bonding layer may be attached onto the bonding layer 150 or the n-type drift layer 130.

Figure 3D:
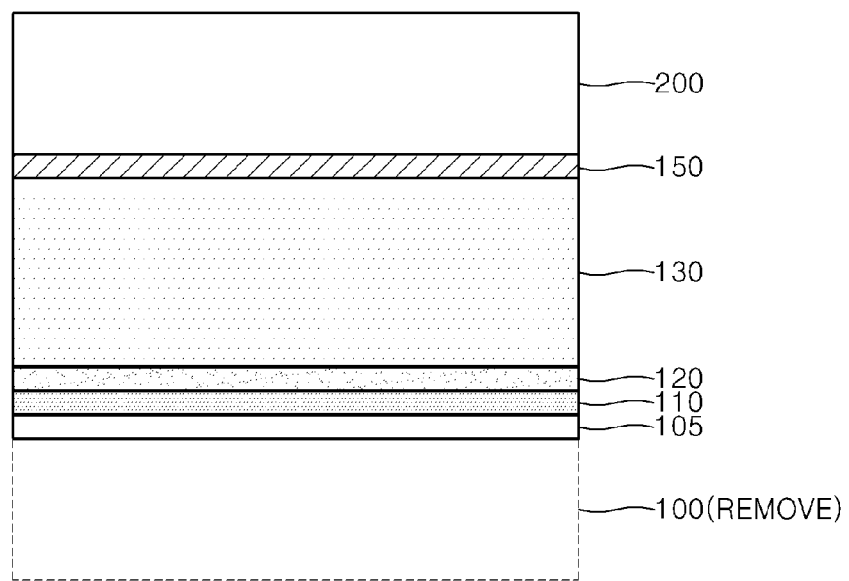

Referring to FIG. 3D, the first substrate 100 may be removed. The first substrate 100 may be removed in various ways. For example, after a lower portion of the first substrate 100 is removed via a polishing process, the remaining portion of the first substrate 100 may be removed via a desired (or alternatively predetermined) or given etching process. The etching process for removing the remaining portion of the first substrate 100 may be a dry etching process. If the first substrate 100 is a Si substrate, the first substrate 100 may be etched by using an etching gas containing $SF_6$, for example. However, the etching process for removing the remaining portion of the first substrate 100 is not limited to dry etching processes. If necessary, the remaining portion of the first substrate 100 may be removed via a wet etching process. The methods of removing the first substrate 100 described above are merely examples, and the first substrate 100 may be removed in various other ways.

Figure 3E:
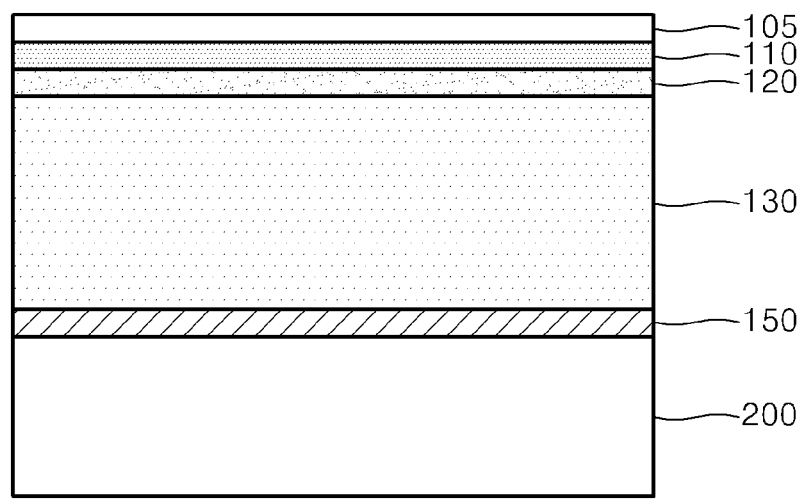
Figure 3F:
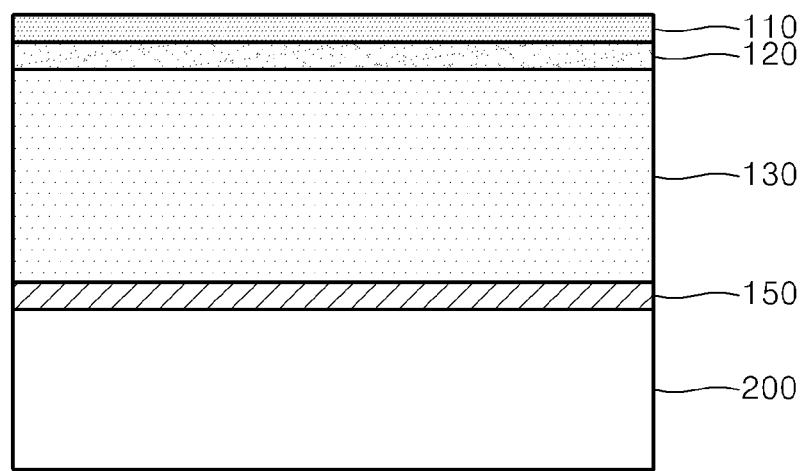

The structure as shown in FIG. 3E may be acquired by turning the structure of FIG. 3D, from which the first substrate 100 is removed, upside down. The structure shown in FIG. 3E may be considered as a structure in which the bonding layer 150, the n-type drift layer 130, the p-type channel layer 120, the n-type contact layer 110, and the buffer layer 105 are stacked on the second substrate 200 in the order stated. Next, the buffer layer 105 may be removed. The structure acquired by removing the buffer layer 105 from the structure of FIG. 3E is shown in FIG. 3F.

Figure 3G:
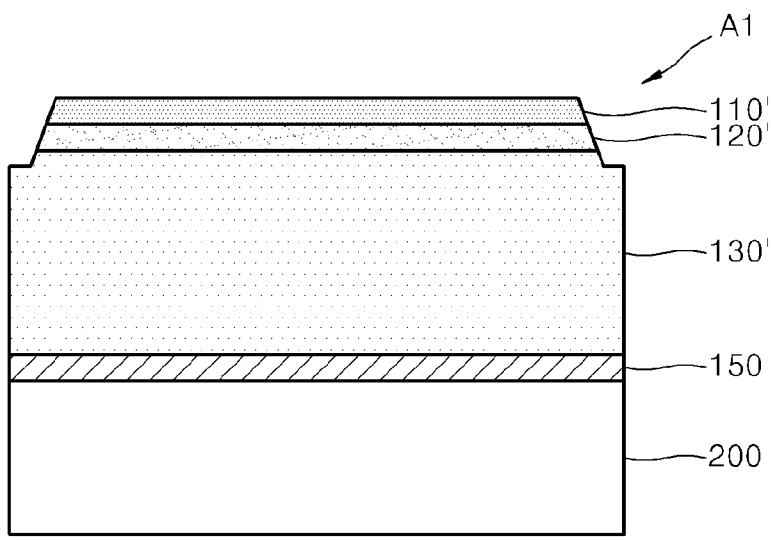

Referring to FIG. 3G, an active region A1 may be defined by patterning at least the n-type contact layer 110 and the p-type channel layer 120. An etching (patterning) process for defining the active region A1 may be performed to a desired (or alternatively predetermined) depth of the n-type drift layer 130. The active region A1 defined as described above may be a region in which a single device is to be formed. In this regard, the active region A1 may be referred to as a "device region". Although only one active region A1 is illustrated for convenience of explanation, a plurality of active regions A1 that are apart from each other may be actually formed. In other words, sizes (diameters) of the second substrate 200 and the layers formed thereon 150, 130, 120, and 110 may be larger than those shown in FIG. 3F, and the plurality of active regions A1 may be defined therefrom.

Figure 3H:
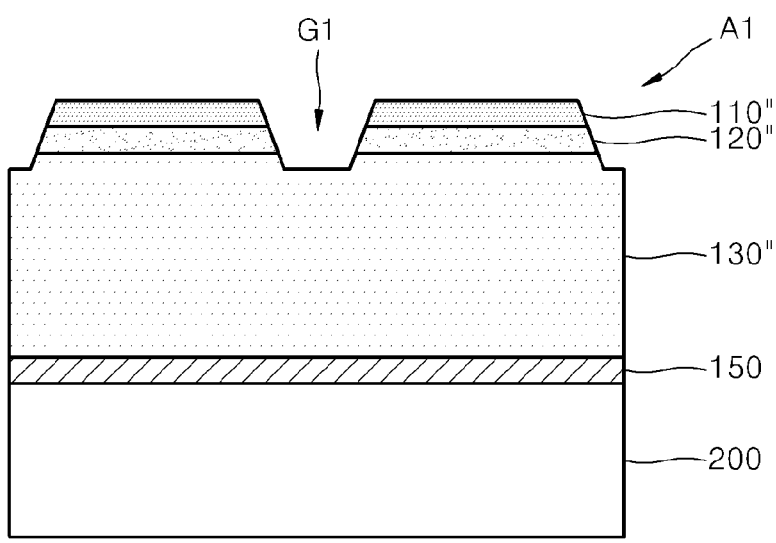

Referring to FIG. 3H, a groove G1 for forming a gate (330 of FIG. 3J) may be formed by etching a desired (or alternatively predetermined) portion (e.g., the center portion) of the active region A1. The groove G1 may be formed to a desired (or alternatively predetermined) depth of the n-type drift layer 130. The two opposite sidewalls of the groove G1 may be tilted by a desired (or alternatively predetermined) angle, and the width of the groove G1 may be tapered downward. For example, the groove G1 may have a reversed-trapezoidal cross-section. In the active region A1, the stacked structure including the p-type channel layer 120 and the n-type contact layer 110 may be divided into two portions by the groove G1.

Figure 3I:
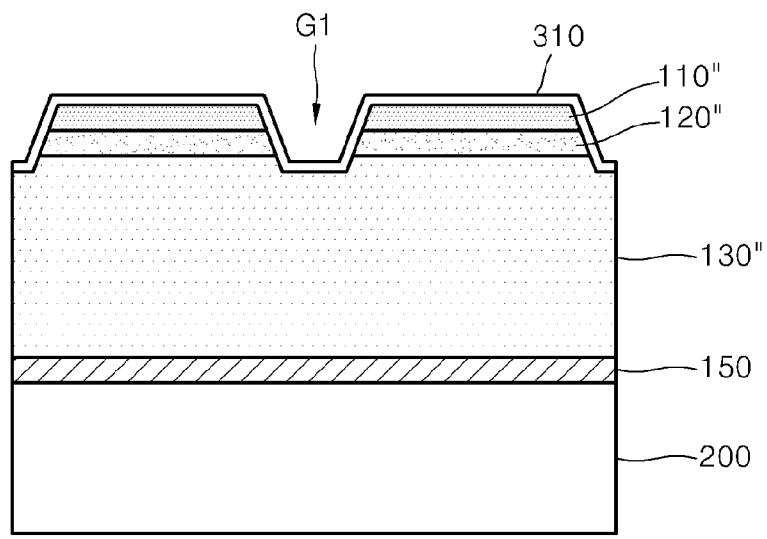

Referring to FIG. 3I, a gate insulation layer 310 which covers the groove G1 may be formed on the n-type contact layer 110, the p-type channel layer 120, and the n-type drift layer 130. The gate insulation layer 310 may be formed of a silicon oxide, a silicon oxynitride, or a silicon nitride, or may be formed of other materials, for example, a high-k material having a dielectric constant higher than that of a silicon nitride. Furthermore, the gate insulation layer 310 may also be formed of an organic insulation material. The gate insulation layer 310 may have a single-layer structure or a multi-layer structure.

Figure 3J:
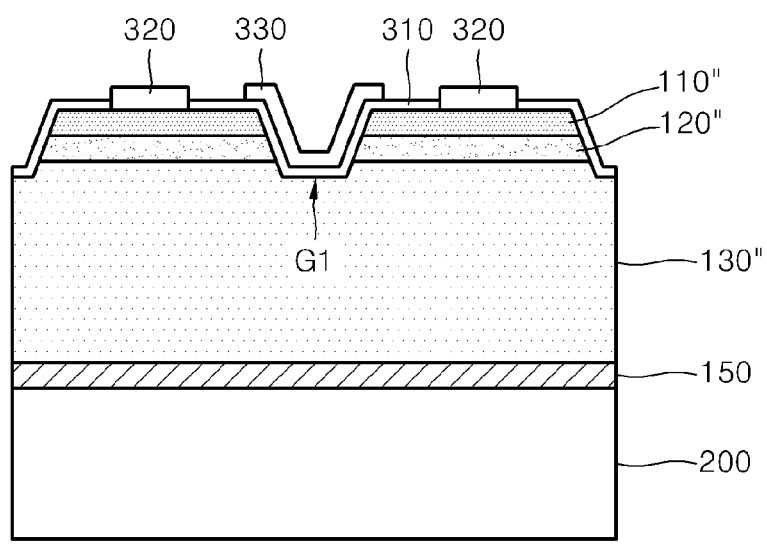

Referring to FIG. 3J, source electrodes 320 contacting portions of the n-type contact layer 110 around the groove G1 may be formed. After portions of the gate insulation layer 310 around the groove G1 are removed, the source electrodes 320 may be formed on the exposed portions of the n-type contact layer 110. The source electrodes 320 may be disposed at both sides of the groove G1. A gate 330 may be formed on the gate insulation layer 310 in the groove G1. The gate 330 may cover the bottom surface and the two opposite sidewalls of the groove G1 and may partly extend onto the n-type contact layer 110 adjacent to the groove G1. The gate 330 may be formed after the source electrodes 320 are formed. Alternatively, the source electrodes 320 and the gate 330 may be simultaneously formed, or the gate 330 may be formed before the source electrodes 320 are formed.

In the structure shown in FIG. 3J, if the second substrate 200 is formed of a conductive material, the second substrate 200 may be used as a drain electrode. Since the bonding layer 150 may be a conductive layer (e.g., a metal layer), the bonding layer 150 and the second substrate 200 may be considered as constituting a single drain electrode. A semiconductor device fabricated according to example embodiments as described above may be a vertical type device (transistor) having the source electrodes 320 and the drain electrode 200 at an upper portion and a lower portion thereof, respectively. Here, the p-type channel layer 120 and the n-type drift layer 130 may be GaN-based material layers, and thus the vertical type device (transistor) may be a GaN-based device. According to example embodiments, a conductive substrate, such as a metal substrate, may be easily employed as a final substrate (that is, the second substrate 200) via the bonding of the second substrate 200 and removing of the first substrate 100, and thus a vertical type device which employs a final substrate (that is, the second substrate 200) as an electrode (the drain electrode) may be easily fabricated. Furthermore, if the final substrate (that is, the second substrate 200) is a conductive substrate, such as a metal substrate, the final substrate has very high thermal conductivity, and thus the final substrate may feature excellent heat dissipation properties. Therefore, according to example embodiments, a GaN-based vertical type device with excellent heat dissipation properties may be embodied.

If the second substrate 200 is not a conductor in FIG. 3J, a drain electrode that is connected to the bonding layer 150 may be additionally formed in the second substrate 200. An example thereof is shown in FIG. 4.

Figure 4:
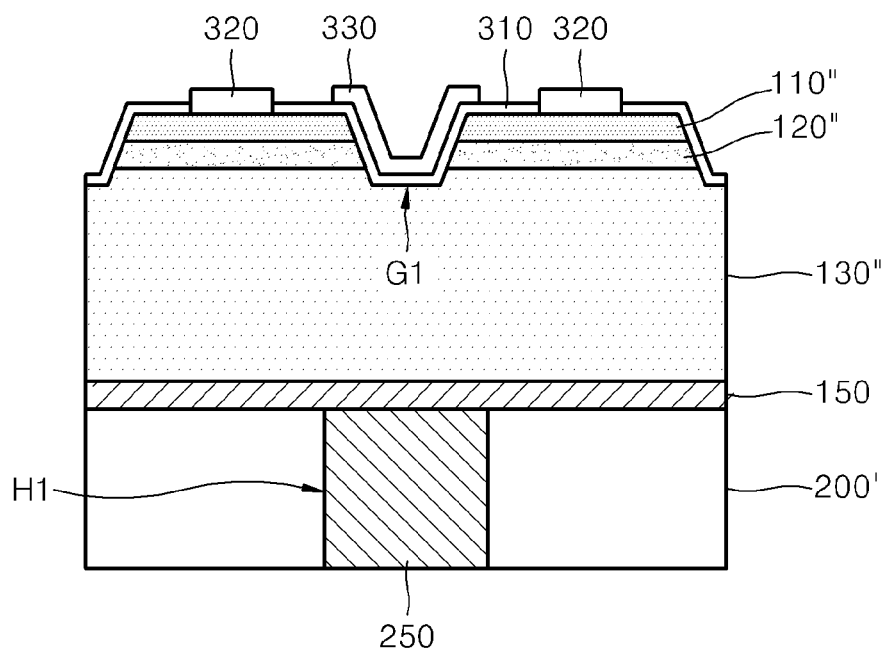
FIG. 4 is a cross-sectional view for describing a semiconductor device according to example embodiments and a method of fabricating the same.

Referring to FIG. 4, after a hole H1 that exposes the bonding layer 150 is formed in the second substrate 200, a drain electrode 250 contacting the bonding layer 150 may be formed in the hole H1. The bonding layer 150 may be a metal layer, and thus the drain electrode 250 may be electrically connected to the n-type drift layer 130 via the bonding layer 150. Since the drain electrode 250 is formed in the second substrate 200, the second substrate 200 may be considered as including the drain electrode 250. Although not shown, a conductive layer contacting the drain electrode 250 may be further formed on the lower surface of the second substrate 200.

Figure 5A:
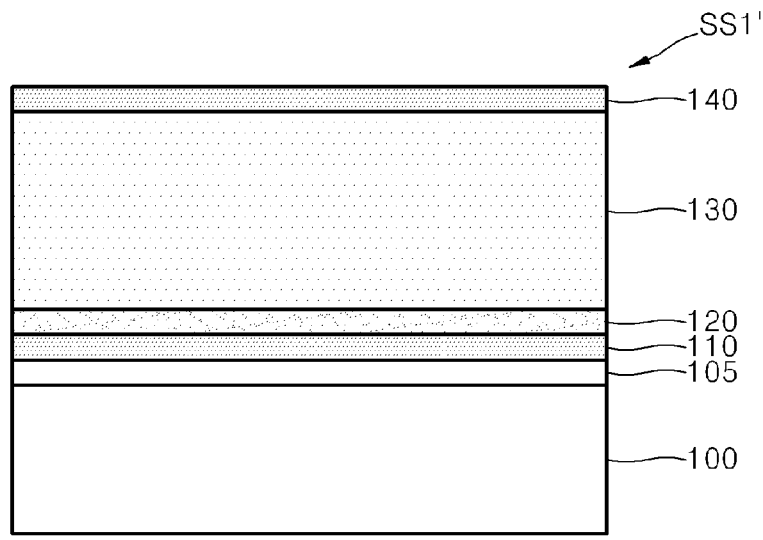
FIGS. 5A and 5B are cross-sectional views showing a method of fabricating a semiconductor device, according to example embodiments.
Figure 5B:
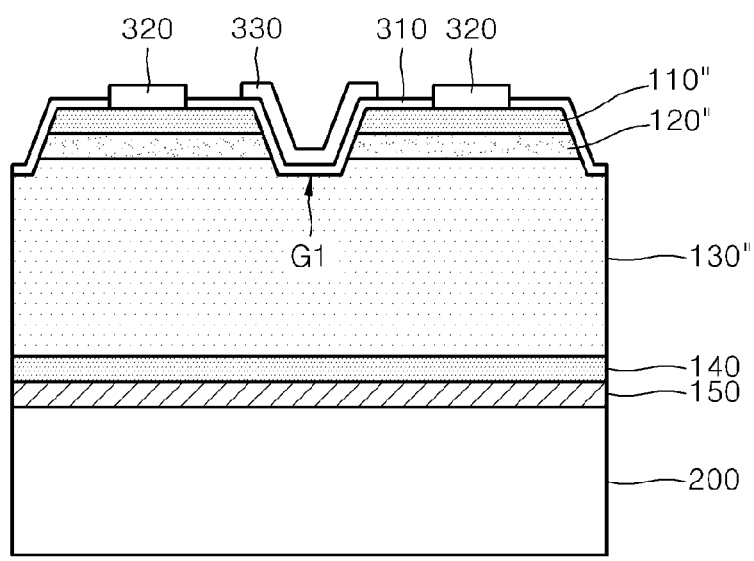

FIGS. 5A and 5B are cross-sectional views showing a method of fabricating a semiconductor device, according to example embodiments.

Referring to FIG. 5A, the substrate structure SS1' as shown in FIG. 2 may be provided. In other words, the substrate structure SS1' in which the buffer layer 105, the n-type first contact layer 110, the p-type channel layer 120, the n-type drift layer 130, and the n-type second contact layer 140 are stacked on the first substrate 100 in the order stated may be provided.

The structure as shown in FIG. 5B may be acquired by using the substrate structure SS1' as the starting structure and applying the method as described above with reference to FIGS. 3B through 3J. Referring to FIG. 5B, the n-type second contact layer 140 is arranged between the second substrate 200 and the n-type drift layer 130. In a case of using the bonding layer 150, the n-type second contact layer 140 may be arranged between the bonding layer 150 and the n-type drift layer 130. A contact property between the n-type drift layer 130 and the bonding layer 150 may be improved by the n-type second contact layer 140, and thus a performance of the semiconductor device may be improved. Except that the n-type second contact layer 140 is further arranged, the structure shown in FIG. 5B may be identical to the structure shown in FIG. 3J.

In the structure shown in FIG. 5B, if the second substrate 200 is a conductor, the second substrate 200 may be used as a drain electrode. Since the bonding layer 150 may be a conductive layer (e.g., a metal layer), the bonding layer 150 and the second substrate 200 may be considered as constituting a single drain electrode.

Figure 6:
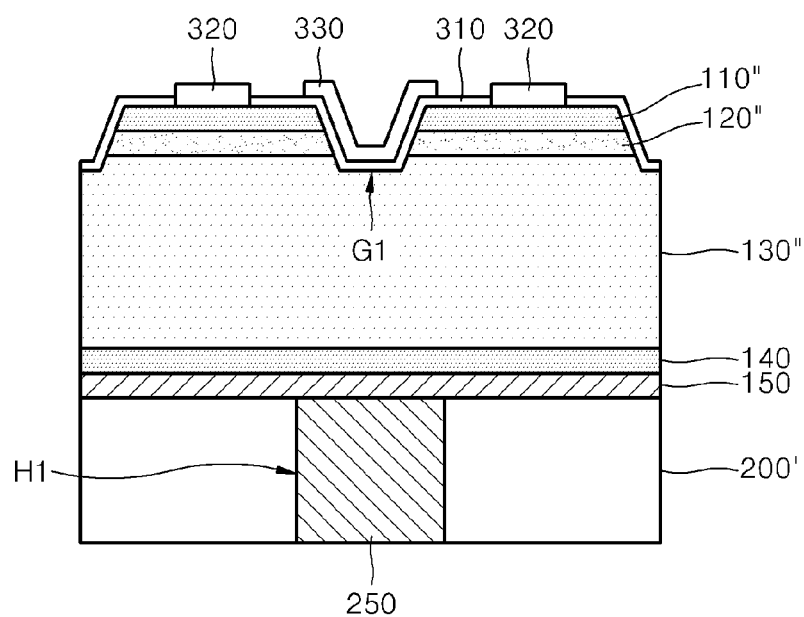
FIG. 6 is a cross-sectional view for describing a semiconductor device according to example embodiments and a method of fabricating the same.

If the second substrate 200 is not a conductor in FIG. 5B, a drain electrode that is connected to the bonding layer 150 may be separately formed in the second substrate 200. An example thereof is shown in FIG. 6. Referring to FIG. 6, the drain electrode 250 is arranged in the second substrate 200. Except that the n-type second contact layer 140 is further arranged, the structure shown in FIG. 6 may be identical to the structure shown in FIG. 4.

FIGS. 3J, 4, 5B, and 6 are cross-sectional diagrams showing structures of the semiconductor devices according to embodiments, respectively. Each of the semiconductor devices may include the second substrate 200, the bonding layer 150 arranged on the second substrate 200, the n-type drift layer 130 arranged on the bonding layer 150, a stacked structure including the p-type channel layer 120 and n-type contact layer 110 that are stacked on the n-type drift layer 130 in the order stated and having the groove G1 that exposes the n-type drift layer 130, the gate insulation layer 310 arranged to cover the groove G1, the gate 330 arranged on the gate insulation layer 310, and the source electrode 320 arranged on portions of the n-type contact layer 110 around the groove G1. Here, the second substrate 200 may either function as a drain electrode (FIGS. 3J and 5) or include the separate drain electrode 250 (FIGS. 4 and 6). The bonding layer 150 may be a metal layer. Furthermore, the n-type second contact layer 140 may be further arranged between the second substrate 200 and the n-type drift layer 130 (FIGS. 5B and 6). The n-type second contact layer 140 may be arranged between the bonding layer 150 and the n-type drift layer 130. When the p-type channel layer 120 is activated by the gate 330 and a desired (or alternatively predetermined) voltage is applied between the source electrode 320 and the drain electrode 200 or 250, a desired (or alternatively predetermined) current may flow from the source electrode 320 to the drain electrode 200 or 250 via the n-type contact layer 110, the p-type channel layer 120, and the n-type drift layer 130.

Such a semiconductor device according to example embodiments is a vertical type device (e.g., a vertical GaN-based transistor). Compared to a planar type device (horizontal type device), such a vertical type device has superior voltage withstanding property and may easily be scaled down. Therefore, if the semiconductor device is employed as a power device, a compact power device with high voltage withstanding property may be embodied.

A GaN-based device in the related art is fabricated based on a GaN bulk wafer, thus featuring relatively low productivity and high fabrication cost. However, a semiconductor device according to example embodiments is fabricated based on a non-GaN-based substrate 100 that may be fabricated to a large size and is inexpensive, and thus the semiconductor device according to example embodiments may be mass-produced at relatively low cost. Therefore, the semiconductor device according to example embodiments may be better than a GaN-based device in the related art in terms of fabrication cost and productivity.

Furthermore, in the semiconductor device according to example embodiments, a conductive substrate, such as a metal substrate, may be easily employed as a final substrate (that is, the second substrate 200), a vertical type device employing the final substrate (that is, the second substrate 200) as an electrode (the drain electrode) may be easily fabricated. If the final substrate (that is, the second substrate 200) is a conductive substrate, such as a metal substrate, the final substrate has high thermal conductivity, and thus the semiconductor device including the final substrate may feature excellent heat dissipation properties. Furthermore, the semiconductor device according to example embodiments may include the bonding layer 150 (e.g., a metal layer) between the second substrate 200 and the n-type drift layer 130, and thus an electric contact property between the n-type drift layer 130 and the second substrate 200 or between the n-type second contact layer 140 and the second substrate 200 may be improved by the bonding layer 150 (e.g., a metal layer). Therefore, a performance of the semiconductor device may be improved by the bonding layer 150 (e.g., metal layer).

Configurations of the semiconductor devices according to embodiments described above with reference to FIGS. 3J, 4, 5B, and 6 may be modified in various ways. For example, conductive types of the n-type contact layers 110 and 140, the p-type channel layer 120, and the n-type drift layer 130 may be changed. In other words, the n-type contact layers 110 and 140 may be replaced with p-type contact layers, the p-type channel layer 120 may be replaced with an n-type channel layer, and the n-type drift layer 130 may be replaced with a p-type drift layer. Furthermore, although the groove G1 is formed in a stacked structure including the n-type contact layer 110 and the p-type channel layer 120, the gate 330 is formed in the groove G1, and the source electrodes 320 are formed at both sides of the gate 330, example embodiments are not limited thereto and the structure may vary.

While some example embodiments have been shown and described, it will be understood by those of ordinary skill in the art that various changes in form and details may be made therein without departing from the spirit and scope as defined by the following claims.

For example, the substrate structures SS1 and SS1' of FIGS. 1 and 2 and semiconductor devices employing the same may be fabricated based on (semiconductor) materials other than GaN-based materials. Furthermore, the substrate structures SS1 and SS1' of FIGS. 1 and 2 may be applied to fabrication of semiconductor devices having structures other than the structures shown in FIGS. 3J, 4, 5B, and 6. Furthermore, the semiconductor devices shown in FIG. 3J, 4, 5B, and 6 may not only be used as power devices, but also be used for other purposes. Furthermore, the methods of fabricating semiconductor devices described with reference to FIGS. 3A through 6 may vary.

What is claimed is:

1. A substrate structure comprising:
a non-GaN-based substrate;
a buffer layer on the non-GaN-based substrate;
a GaN-based first material layer on the buffer layer,
    the GaN-based first material layer being doped with a first impurity that is a first conductive type;
a GaN-based second material layer on the GaN-based first material layer,
    the GaN-based second material layer being doped with a second impurity that is a second conductive type,
    the GaN-based second material layer having a density of the second impurity that is less than a density of the first impurity in the first GaN-based material layer; and
a GaN-based third material layer on the GaN-based second material layer,
    the GaN-based third material layer being doped with a third impurity that is the first conductive type,
    the GaN-based third material layer having a density of third impurity that is less than the density of the first impurity of the GaN-based first material layer.

2. The substrate structure of claim 1, wherein the non-GaN-based substrate is one of a Si substrate, a sapphire substrate, and a SiC substrate.

3. The substrate structure of claim 1, wherein the density of the first impurity of the GaN-based first material layer is from about $10^{18}/cm^3$ to about $10^{21}/cm^3$.

4. The substrate structure of claim 1, wherein the density of the second impurity of the GaN-based second material layer is from about $10^{14}/cm^3$ to about $10^{18}/cm^3$.

5. The substrate structure of claim 1, wherein the density of the third impurity of the GaN-based third material layer is from about $10^{14}/cm^3$ to about $10^{18}/cm^3$.

6. The substrate structure of claim 1, further comprising:
a GaN-based fourth material layer on the GaN-based third material layer, wherein
the GaN-based fourth material layer is doped with a fourth impurity that is the first conductive type, and
a density of the fourth impurity of the GaN-based fourth material layer is greater than at least one of the density of the second impurity of the GaN-based second material layer and the density of the third impurity of the GaN-based third material layer.

7. The substrate structure of claim 1, wherein
the first conductive type is n-type,
the second conductive type is p-type, and
the first impurity is the same as the third impurity.

8. A semiconductor device comprising:
a substrate including a drain electrode;
a metal layer on the substrate;
a drift layer on the metal layer,
    the drift layer having a first conductive type;
a stacked structure on the drift layer,
    the stacked structure including a channel layer having a second conductive type and a first contact layer having the first conductive type,
    the channel layer and the first contact layer defining a groove that exposes the drift layer;
a gate insulation layer covering the groove;
a gate on the gate insulation layer; and
a source electrode contacting the first contact layer,
    wherein a first surface of the metal layer on a side of the substrate directly contacts the drain electrode, and a second surface of the metal layer on a side of the drift layer directly contacts a GaN-based material.

9. The semiconductor device of claim 8, wherein the substrate is the drain electrode.

10. The semiconductor device of claim 8, wherein
the substrate defines a hole that exposes the metal layer, and
the drain electrode is in the hole.

11. The semiconductor device of claim 8, wherein at least one of the first contact layer, the channel layer, and the drift layer contains a GaN-based material.

12. The semiconductor device of claim 8, wherein
the first contact layer is doped with a first impurity that is the first conductive type at a density of from about $10^{18}/cm^3$ to about $10^{21}/cm^3$,
the channel layer is a doped with a second impurity that is the second conductive type at a density of from about $10^{14}/cm^3$ to about $10^{18}/cm^3$, and
the drift layer is doped with a third impurity that is the first conductive type at a density of from about $10^{14}/cm^3$ to about $10^{18}/cm^3$.

13. The semiconductor device of claim 8, further comprising:
a second contact layer between the metal layer and the drift layer.

14. The semiconductor device of claim 13, wherein
the second contact layer is doped with a fourth impurity that is the first conductive type at a density of from about $10^{18}/cm^3$ to about $10^{21}/cm^3$.

15. The semiconductor device of claim 8, wherein
the first conductive type is n-type,
the second conductive type is p-type,
the first impurity is the same as the third impurity.

16. A semiconductor device comprising:
a drain electrode;
a metal layer on the drain electrode;
a drift layer on the metal layer,
    the drift layer having a first conductive type;
a channel layer having a second conductive type and a first contact layer having the first conductive type on the drift layer,
    the channel layer and the first contact layer defining a groove that exposes the drift layer;
a gate insulating layer in the groove;
a gate electrode on the gate insulating layer; and
at least one source electrode on the first contact layer,
    wherein a first surface of the metal layer on a side of the drain electrode directly contacts the drain electrode, and a second surface of the metal layer on a side of the drift layer directly contacts a GaN-based material.

17. The semiconductor device of claim 16, further comprising:
a substrate defining a hole, wherein
the drain electrode is in the hole of the substrate.

18. The semiconductor device of claim 16, further comprising:
a second contact layer on the metal layer,
    the second contact layer having the first conductive type,
    the second contact layer having a density of a first conductive type impurity that is different than a density of a first conductive type impurity in the drift layer.

19. The semiconductor device of claim 16, wherein
the first contact layer is doped with a first impurity that is the first conductive type at a density of from about $10^{18}/cm^3$ to about $10^{21}/cm^3$,
the channel layer is a doped with a second impurity that is the second conductive type at a density of from about $10^{14}/cm^3$ to about $10^{18}/cm^3$, and
the drift layer is doped with a third impurity that is the first conductive type at a density of from about $10^{14}/cm^3$ to about $10^{18}/cm^3$.

\* \* \* \* \*